United States Patent
Jeong (10) Patent No.: US 11,380,571 B2
(45) Date of Patent: Jul. 5, 2022

(54) CHUCK ASSEMBLY AND METHOD OF SECURING ELECTROSTATIC CHUCK

(71) Applicant: XIA TAI XIN SEMICONDUCTOR (QING DAO) LTD., Qingdao (CN)

(72) Inventor: Woohyun Jeong, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 386 days.

(21) Appl. No.: 16/660,730

(22) Filed: Oct. 22, 2019

(65) Prior Publication Data
US 2020/0219748 A1 Jul. 9, 2020

Related U.S. Application Data

(60) Provisional application No. 62/778,899, filed on Dec. 13, 2018.

(51) Int. Cl.
*H01L 21/683* (2006.01)
*H01J 37/32* (2006.01)

(52) U.S. Cl.
CPC .... *H01L 21/6833* (2013.01); *H01J 37/32715* (2013.01); *H01J 2237/2007* (2013.01)

(58) Field of Classification Search
CPC ............ H01L 21/6833; H01J 37/32715; H01J 2237/2007

USPC ......................................................... 361/234
See application file for complete search history.

(56) References Cited

U.S. PATENT DOCUMENTS

| | | | |
|---|---|---|---|
| 2010/0039747 A1* | 2/2010 | Sansoni | H01L 21/67103 361/234 |
| 2013/0201596 A1* | 8/2013 | Chen | H01L 21/6833 361/234 |
| 2015/0221540 A1* | 8/2015 | Qin | H01L 21/76251 438/455 |
| 2016/0020128 A1* | 1/2016 | Wang | H01L 21/6833 361/234 |

* cited by examiner

*Primary Examiner* — Yemane Mehari
(74) *Attorney, Agent, or Firm* — ScienBiziP, P.C.

(57) ABSTRACT

The present disclosure provides an electrostatic chuck for holding a wafer. The electrostatic chuck includes at least one dielectric layer, an electrode layer coupled to the dielectric layer, and a chuck base. The chuck base includes a plurality of lock holes. The dielectric layer and the electrode layer are disposed on the chuck base. Each of the lock holes of the chuck base includes a first portion and a second portion connected to the first portion. The first portion has a first opening on a bottom surface of the chuck base. The second portion has a second opening on the bottom surface of the chuck base. A width of the second opening of the second portion is smaller than a width of the first opening of the first portion.

19 Claims, 9 Drawing Sheets

→ : Screw tightening direction
→ : Shear stress direction

FIG. 4 ced chuck base. A width of the second opening of the second portion is smaller than a width of the first opening of the first portion.

To achieve the above object, another implementation of the present disclosure provides a chuck assembly for holding a wafer. The chuck assembly includes an electrostatic chuck and a support body configured to secure the electrostatic chuck. The electrostatic chuck includes at least one dielectric layer, an electrode layer coupled to the dielectric layer, and a chuck base. The chuck base includes a plurality of lock holes. The dielectric layer and the electrode layer are disposed on the chuck base. Each of the lock holes of the chuck base includes a first portion and a second portion connected to the first portion. The first portion has a first opening on a bottom surface of the chuck base. The second portion has a second opening on the bottom surface of the chuck base. A width of the second opening of the second portion is smaller than a width of the first opening of the first portion. The support body has a plurality of screw holes formed corresponding to the plurality of lock holes of the chuck base of the electrostatic chuck. The electrostatic chuck is secured to the support body by a plurality of lock studs disposed corresponding to the plurality of lock holes of the chuck base.

To achieve the above object, yet another implementation of the present disclosure provides a method of securing an electrostatic chuck. The method includes actions S401 to S404. In action S401, a support body having a plurality of screw holes is provided. In action S402, a plurality of lock studs corresponding to the plurality of screw holes is tightened onto the support body. Each of the lock studs includes a lock head and a screw stud connected to the lock head. The screw stud of each of the lock studs is coupled to one of the screw holes of the support body. In action S403, the electrostatic chuck is placed on the support body. The electrostatic chuck includes a chuck base. The chuck base includes a plurality of lock holes formed corresponding to the plurality of lock studs. The lock head of each of the lock studs is disposed in the corresponding lock hole of the chuck base. In action S404, the electrostatic chuck is rotated about a center line of the support body to secure the electrostatic chuck onto the support body. The lock head of each of the lock studs is secured in the corresponding lock hole of the chuck base.

As described above, the chuck assembly and the method of the implementations of the present disclosure use lock holes and lock studs to combine the electrostatic chuck and the support body. Therefore, the shear stress on the surface of the electrostatic chuck can be reduced to prevent wafer warpage.

CHUCK ASSEMBLY AND METHOD OF SECURING ELECTROSTATIC CHUCK

CROSS-REFERENCE TO RELATED APPLICATION

This application claims to the benefit of U.S. Provisional Patent Application No. 62/778,899 filed on Dec. 13, 2018, the contents of which are incorporated fully by reference herein.

FIELD

The present disclosure generally relates to a chuck assembly and a method of securing an electrostatic chuck. More specifically, the present disclosure relates to a method of securing an electrostatic chuck onto a support by using a combination of lock holes and lock studs.

BACKGROUND

Semiconductor processing systems are used to process semiconductor wafers for fabrication of integrated circuits. In particular, plasma-enhanced semiconductor processes are commonly used during etching, oxidation, chemical vapor deposition (CVD) processes. The plasma-enhanced semiconductor processes are typically carried out by means of plasma processing systems and generally include a plasma processing chamber to provide a controlled setting. Conventional plasma processing chambers often include electrostatic chucks configured to hold a wafer (e.g., a silicon wafer or substrate) in place for processing. Electrostatic chucks utilize electrostatic force to hold the wafer to the chuck.

Figure 1A:
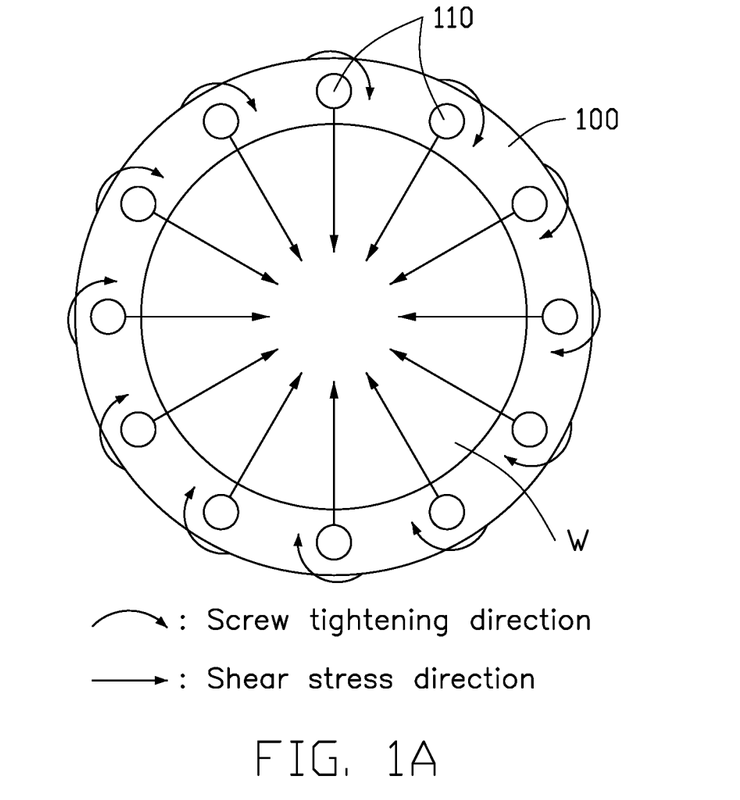
FIGS. 1A and 1B are, respectively, a top view and a side view of an electrostatic chuck clamping a wafer onto a support with screws.
Figure 1B:
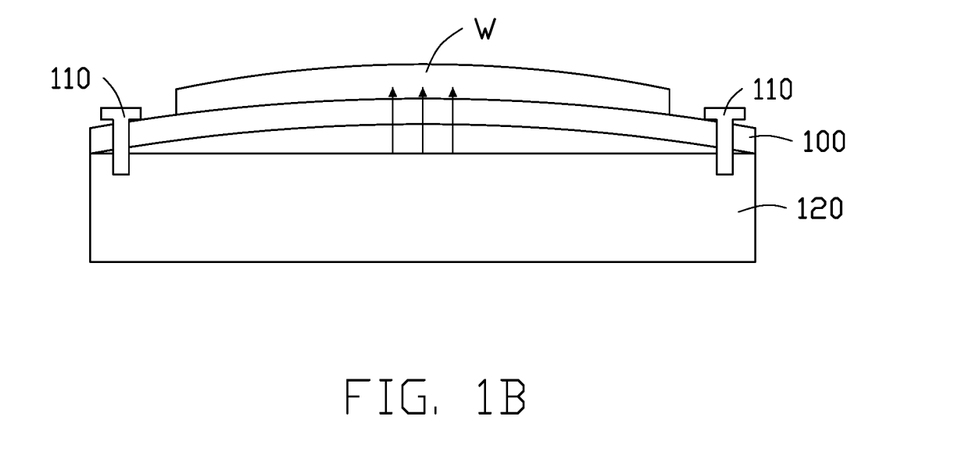

Usually an electrostatic chuck is fixed onto a support body by screws, as shown in FIGS. 1A and 1B. FIGS. 1A and 1B are, respectively, a top view and a side view of a electrostatic chuck 100 clamping a wafer W onto a support 120 with screws 110. When the screws 110 are tightened to secure the electrostatic chuck 100 onto the support 120, a shear stress is applied to the electrostatic chuck 100 towards the center of the electrostatic chuck 100. Therefore, the shear stress may cause the electrostatic chuck 100 to deform, as shown in FIG. 1B. In this case, when the wafer W is placed onto the deformed electrostatic chuck 100, the electrostatic holding force may cause wafer warpage, as shown in FIG. 1B.

Accordingly, there is a need in the art to provide an electrostatic chuck that can reduce and/or substantially eliminate wafer warpage.

SUMMARY

In view of above, an object of the present disclosure is to provide a chuck assembly and a method of securing an electrostatic chuck that can reduce and/or substantially eliminate wafer warpage.

To achieve the above object, an implementation of the present disclosure provides an electrostatic chuck for holding a wafer. The electrostatic chuck includes at least one dielectric layer, an electrode layer coupled to the dielectric layer, and a chuck base. The chuck base includes a plurality of lock holes. The dielectric layer and the electrode layer are disposed on the chuck base. Each of the lock holes of the chuck base includes a first portion and a second portion connected to the first portion. The first portion has a first opening on a bottom surface of the chuck base. The second portion has a second opening on the bottom surface of the

BRIEF DESCRIPTION OF THE DRAWINGS

Implementations of the present technology will now be described, by way of example only, with reference to the attached figures. Aspects of the present disclosure are best understood from the following detailed description when read with the accompanying figures. Various features are not drawn to scale. Dimensions of various features may be arbitrarily increased or reduced for clarity of discussion.

DETAILED DESCRIPTION

The present disclosure will now be described more fully hereinafter with reference to the accompanying drawings, in which exemplary implementations of the disclosure are shown. This disclosure may, however, be embodied in many different forms and should not be construed as limited to the exemplary implementations set forth herein. Rather, these exemplary implementations are provided so that this disclosure will be thorough and complete, and will fully convey the scope of the disclosure to those skilled in the art. Like reference numerals refer to like elements throughout.

The terminology used herein is for the purpose of describing particular exemplary implementations only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, actions, operations, elements, and/or components, but do not preclude the presence or addition of one or more other features, regions, integers, actions, operations, elements, components, and/or groups thereof.

It will be understood that the term "and/or" includes any and all combinations of one or more of the associated listed items. It will also be understood that, although the terms first, second, third etc. may be used herein to describe various elements, components, regions, parts and/or sections, these elements, components, regions, parts and/or sections should not be limited by these terms. These terms are only used to distinguish one element, component, region, part or section from another element, component, region, layer or section. Thus, a first element, component, region, part or section discussed below could be termed a second element, component, region, layer or section without departing from the teachings of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the exemplary implementations of the present disclosure in conjunction with the accompanying drawings in FIGS. 2 to 4. Reference will be made to the drawing figures to describe the present disclosure in detail, wherein depicted elements are not necessarily shown to scale and wherein like or similar elements are designated by same or similar reference numeral through the several views and same or similar terminology.

The present disclosure will be further described hereafter in combination with the accompanying figures.

Figure 2:
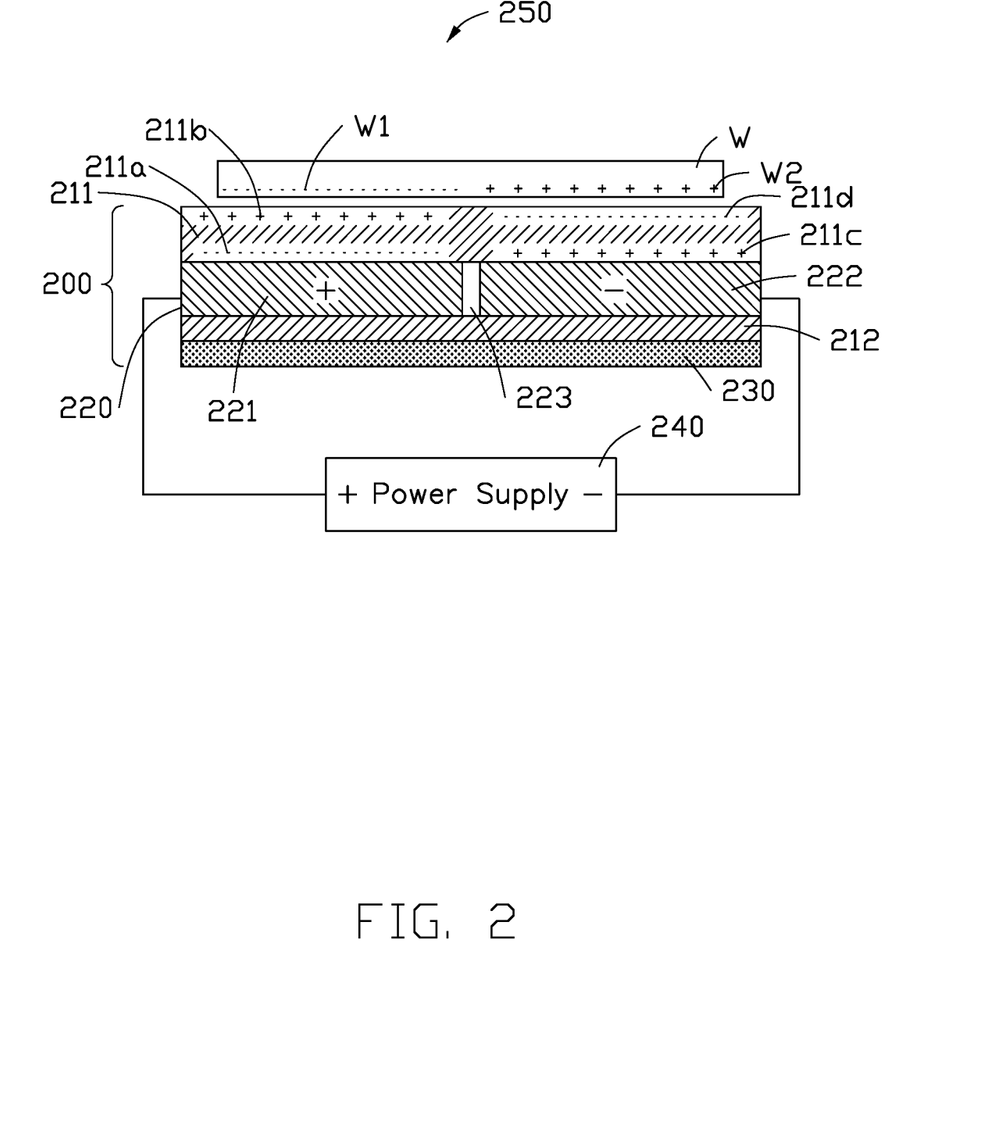
FIG. 2 is a cross-sectional view of an electrostatic chuck according to an implementation of the present disclosure.

Referring to FIG. 2, FIG. 2 is a cross-sectional view of an electrostatic chuck (ESC) according to an example implementation of the present disclosure. As shown in FIG. 2, an electrostatic chuck 200 includes dielectric layers 211 and 212, an electrode layer 220, and a chuck base 230. The electrode layer 220 is disposed between the dielectric layers 211 and 212, and is configured as a pair of poles 221 and 222 in a bipolar electrostatic chuck (ESC) arrangement with an insulator 223 provided therebetween. The dielectric layers 211, 212 and the electrode layer 220 are supported by the chuck base 230. The poles 221 and 222 are coupled to a positive terminal and a negative terminal, respectively, of a power supply 240. Hence, the pole 221 is biased positively, while the pole 222 is biased negatively. The bias potential of each of the poles 221 and 222 induces charges in the adjoining surface regions of the dielectric layers 211 and 212. For example, negative charges are induced on a bottom surface region 211a of the dielectric layer 211 disposed over the pole 221. On the other hand, positive charges are induced at a top surface region 211b of the dielectric layer 211 opposite to the bottom surface region 211a. Similarly, positive charges are induced on a bottom surface region 211c of the dielectric layer 211 disposed over the pole 222, and negative charges builds up on an opposite top surface region 211d of the dielectric layer 211. The positive charges on the top surface region 211b and negative charges on the top surface region 211d of the dielectric layer 211, in turn, induce charges to build up along bottom surface regions W1 and W2 of the wafer W. The induced potential between the dielectric layer 211 and the wafer W generates an electrostatic force that allows the wafer W to be clamped to the electrostatic chuck 200. With the wafer W being clamped, plasma source gases are released into a plasma region 250 over the wafer W for plasma processing such as etching, vapor deposition, sputtering, or the like, until a desired degree of etching or deposition is achieved.

Figure 3A:
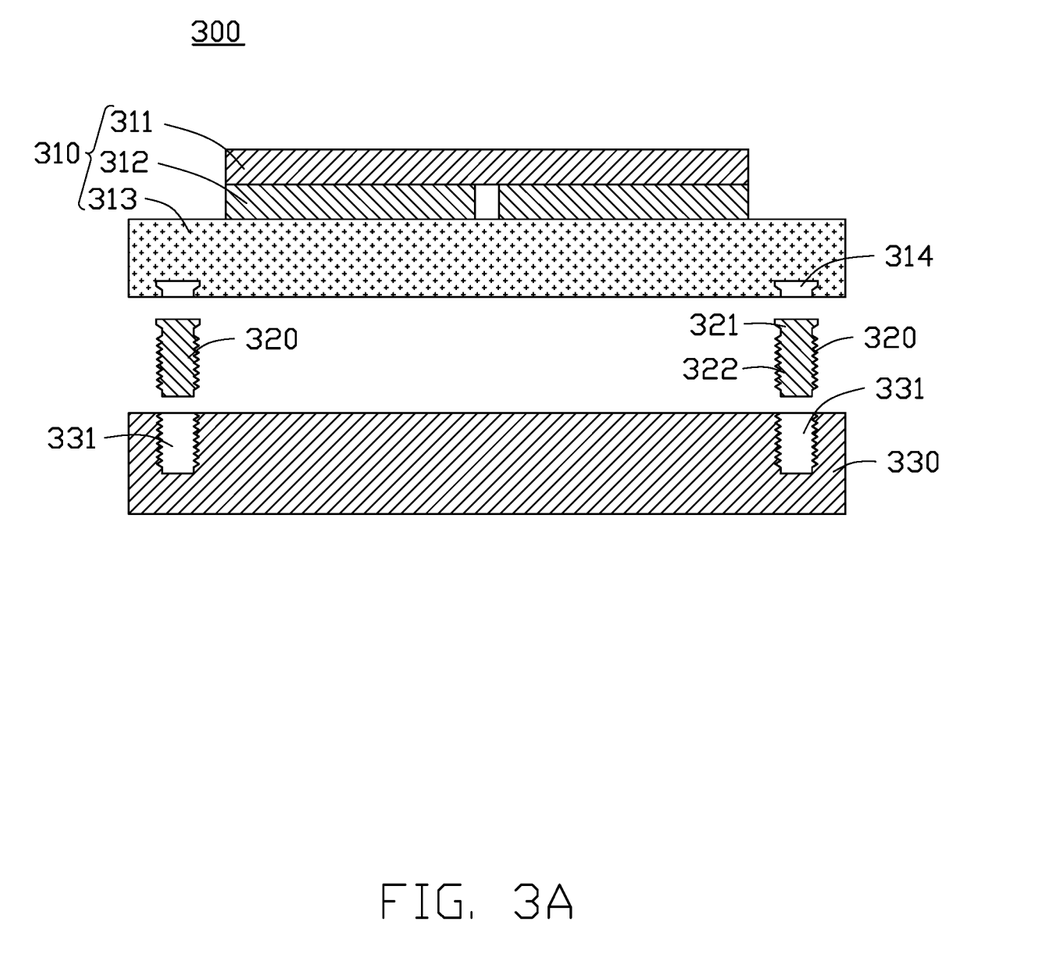
FIG. 3A is an exploded cross-sectional view of a chuck assembly according to another implementation of the present disclosure.
Figure 3B:
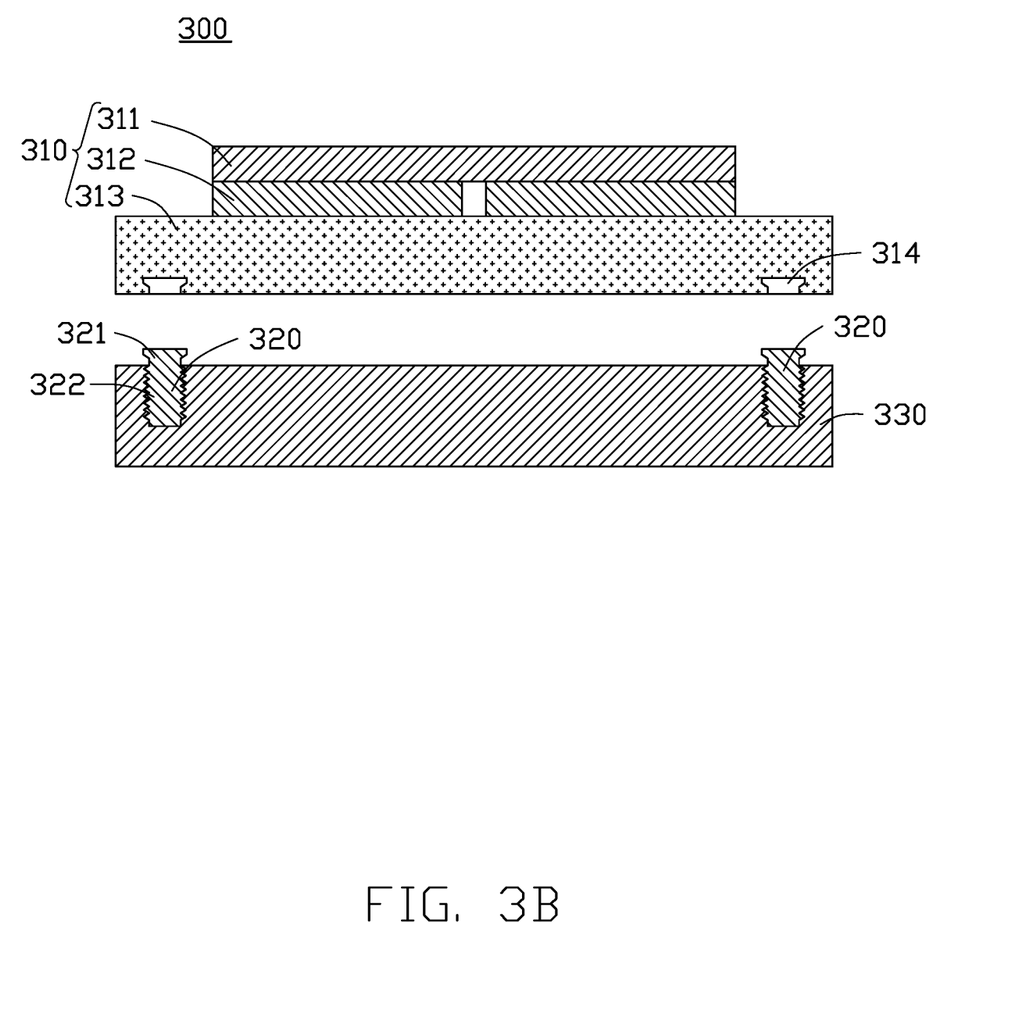
FIG. 3B is a partially assembled cross-sectional view of the chuck assembly of FIG. 3A.
Figure 3C:
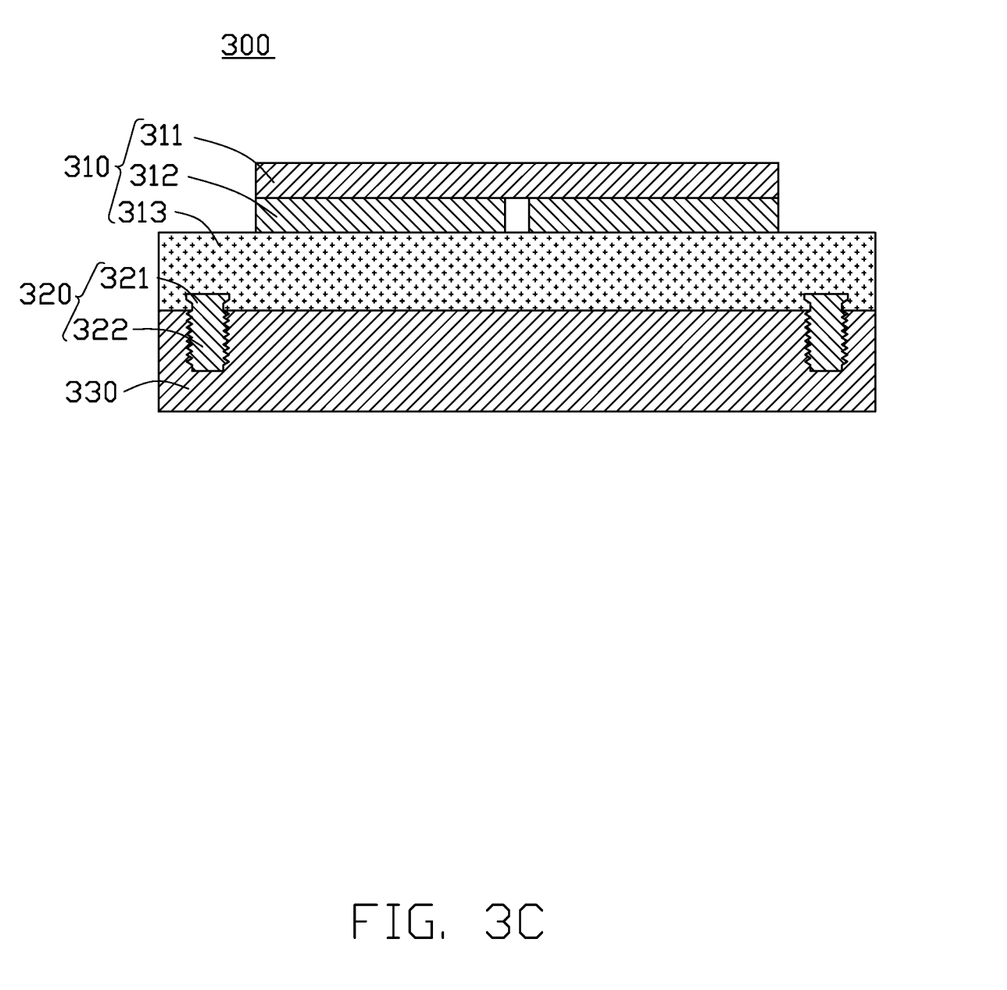
FIG. 3C is an assembled cross-sectional view of the chuck assembly of FIG. 3A.
Figure 3D:
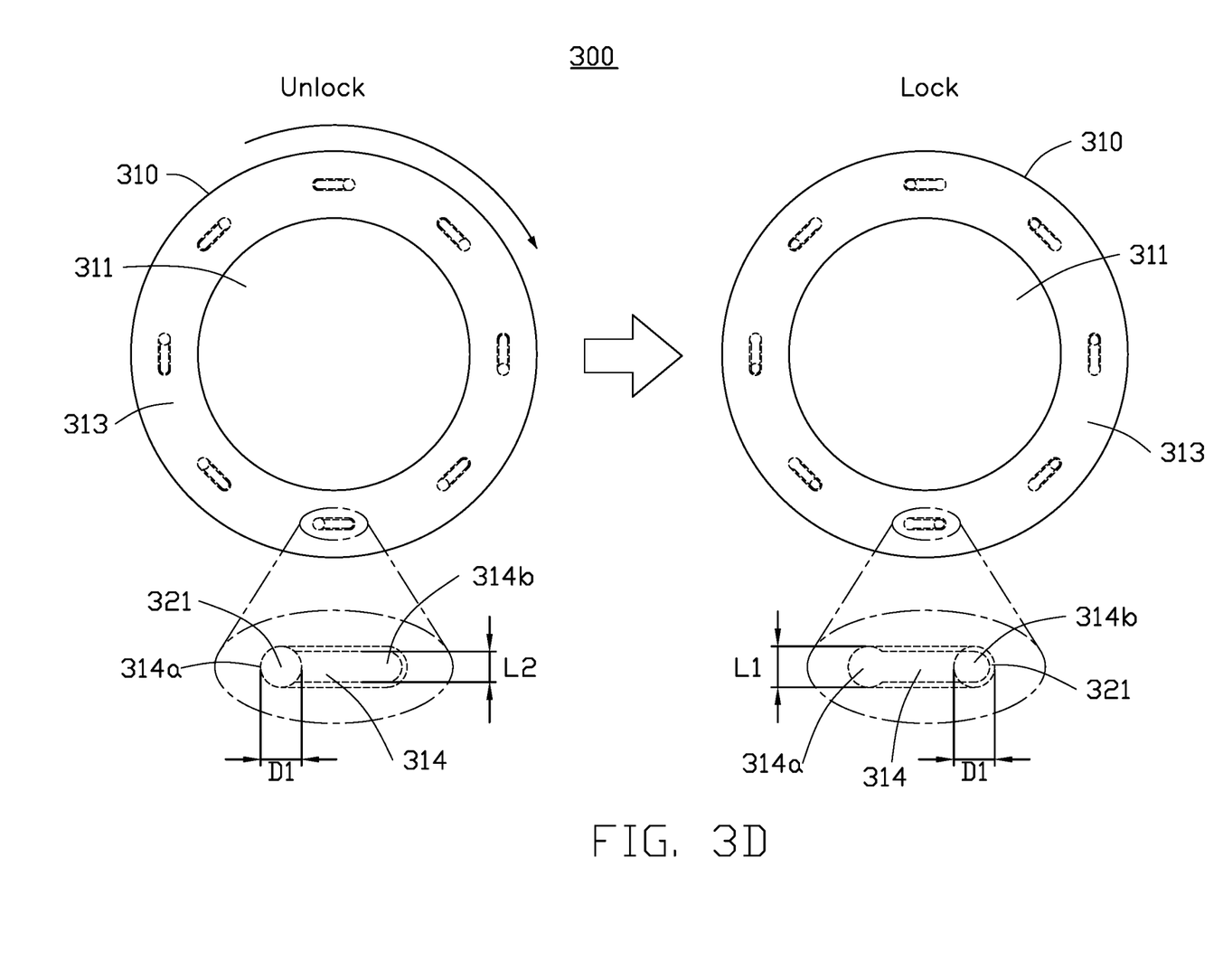
FIG. 3D is top views of the chuck assembly of FIG. 3C at an unlock state and a lock state.
Figure 3E:
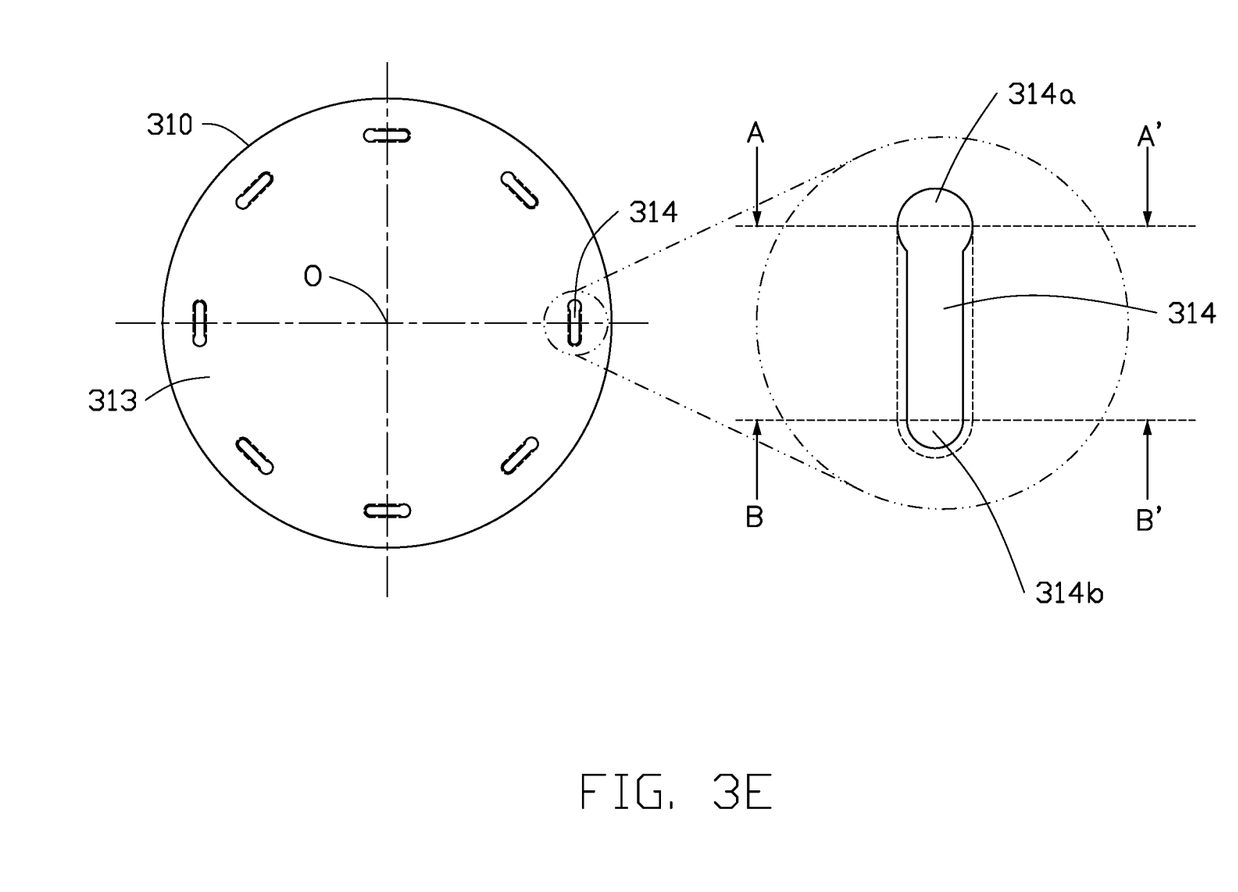
FIG. 3E is a bottom view of an electrostatic chuck of the chuck assembly of FIG. 3A.
Figure 3F:
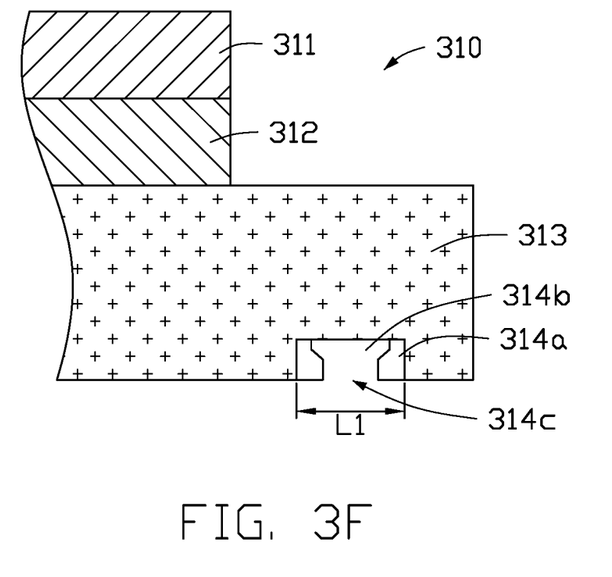
FIGS. 3F and 3G are partially cross-sectional views of the electrostatic chuck of FIG. 3E along line A-A' and line B-B' respectively.
Figure 3G:
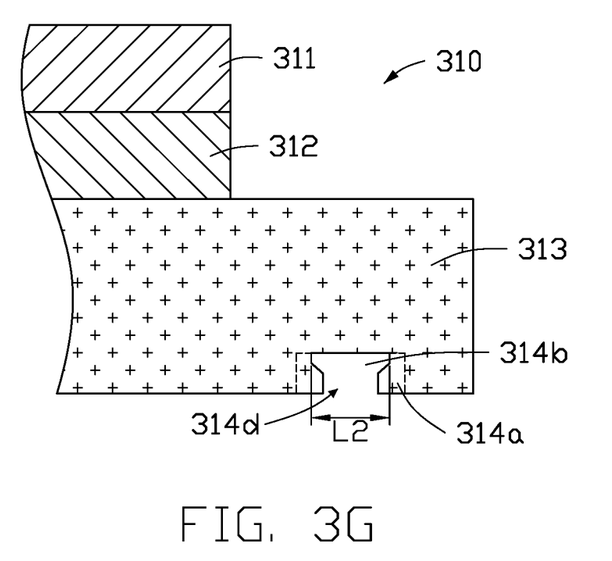

Referring to FIGS. 3A to 3G, various views of a chuck assembly for holding a wafer according to another example implementation of the present disclosure are illustrated. FIG. 3A is an exploded cross-sectional view of a chuck assembly. FIG. 3B is a partially assembled cross-sectional view of the chuck assembly of FIG. 3A. FIG. 3C is an assembled cross-sectional view of the chuck assembly of FIG. 3A. FIG. 3D illustrates top views of the chuck assembly of FIG. 3C in an unlock state and a lock state. FIG. 3E is a bottom view of an electrostatic chuck of the chuck assembly of FIG. 3A. FIGS. 3F and 3G are partially cross-sectional views of the electrostatic chuck of FIG. 3E along line A-A' and line B-B' respectively. As shown in FIGS. 3A to 3C, a chuck assembly 300 of the implementation of the present disclosure includes an electrostatic chuck 310 and a support body 330 configured to secure the electrostatic chuck 310. The electrostatic chuck 310 includes at least one dielectric layer 311, an electrode layer 312 coupled to the dielectric layer 311, and a chuck base 313. The components and functions of the dielectric layer 311 and the electrode layer 312 of the electrostatic chuck 310 may substantially correspond to the dielectric layer 211 and the electrode layer 220 of the electrostatic chuck 200, respectively, in FIG. 2, the details of which are omitted for brevity. The chuck base 313 of the electrostatic chuck 310 includes a plurality of lock holes 314. The dielectric layer 311 and the electrode layer 312 are disposed on the chuck base 313. As shown in FIGS. 3D to 3G, each of the lock holes 314 of the chuck base 313 includes a first portion 314a and a second portion 314b connected to the first portion 314a. As shown in FIGS. 3F and 3G, the first portion 314a has a first opening 314c on a bottom surface of the chuck base 313, and the second portion 314b has a second opening 314d on the bottom surface of the chuck base 313. A width L2 of the second opening 314d of the second portion 314b is smaller than a width L1 of the first opening 314c of the first portion 314a. In the implementation shown in FIGS. 3F and 3G, the first portion 314a of each of the lock holes 314 has a rectangular cross section, and the second portion 314b of each of the lock holes 314 has a T-shaped cross section.

As shown in FIG. 3E, an amount of the plurality of lock holes 314 is an even number. Preferably, the even number falls within a range of eight to thirty. The chuck base 313 has a disc shape. The plurality of lock holes 314 are concentrically positioned around a center point O of the chuck base 313.

As shown in FIGS. 3A to 3C, the support body 330 has a plurality of screw holes 331 formed corresponding to the plurality of lock holes 314 on the chuck base 313 of the electrostatic chuck 310. The electrostatic chuck 310 is secured to the support body 330 by a plurality of lock studs 320 disposed corresponding to the plurality of lock holes 314 on the chuck base 313. Each of the lock studs 320 includes a lock head 321 and a screw stud 322. The lock head 321 of each of the lock studs 320 is configured to be disposed in one of the lock holes 314 of the chuck base 313. The screw stud 322 of each of the lock studs 320 is configured to be secured in one of the screw holes 331 of the support body 330.

As shown in FIGS. 3D, 3F and 3G, when the lock heads 321 of the lock studs 320 are correspondingly disposed in the first portions 314a of the lock holes 314, the chuck assembly 300 is in an unlock state. When the lock heads 321 of the lock studs 320 are correspondingly disposed in the second portions 314b of the lock holes 314, the chuck assembly 300 is in a lock state. The lock head 321 of each of the lock studs 320 has a diameter D1 smaller than or equal to the width L1 of the first opening 314c of the first portion 314a of each of the lock holes 314; and the diameter D1 of the lock head 321 of each of the lock studs 320 is greater than the width L2 of the second opening 314d of the second portion 314b of each of the lock holes 314. The lock studs 320 may be made of metals, such as stainless steel. In one implementation, the size of each of the lock studs 320 is greater than 5/32 inch.

In another example implementation, the present disclosure also provides an electrostatic chuck for holding a wafer. The electrostatic chuck of this implementation can be referred to the electrostatic chuck 310 of FIGS. 3A to 3G. As shown in FIGS. 3A to 3G the electrostatic includes at least one dielectric layer 311, an electrode layer 312 coupled to the dielectric layer 311, and the chuck base 313. The chuck base 313 includes a plurality of lock holes 314. The dielectric layer 311 and the electrode layer 312 are disposed on the chuck base 313. Each of the lock holes 314 of the chuck base 313 includes a first portion 314a and a second portion 314b connected to the first portion 314a. The first portion 314a has a first opening 314c on a bottom surface of the chuck base 313. The second portion 314b has a second opening 314d on the bottom surface of the chuck base 313. A width L2 of the second opening 314d of the second portion 314b is smaller than a width L1 of the first opening 314c of the first portion 314a. Preferably, the first portion 314a of each of the lock holes 314 has a rectangular cross section; and the second portion 314b of each of the lock holes 314 has a T-shaped cross section.

Figure 4:
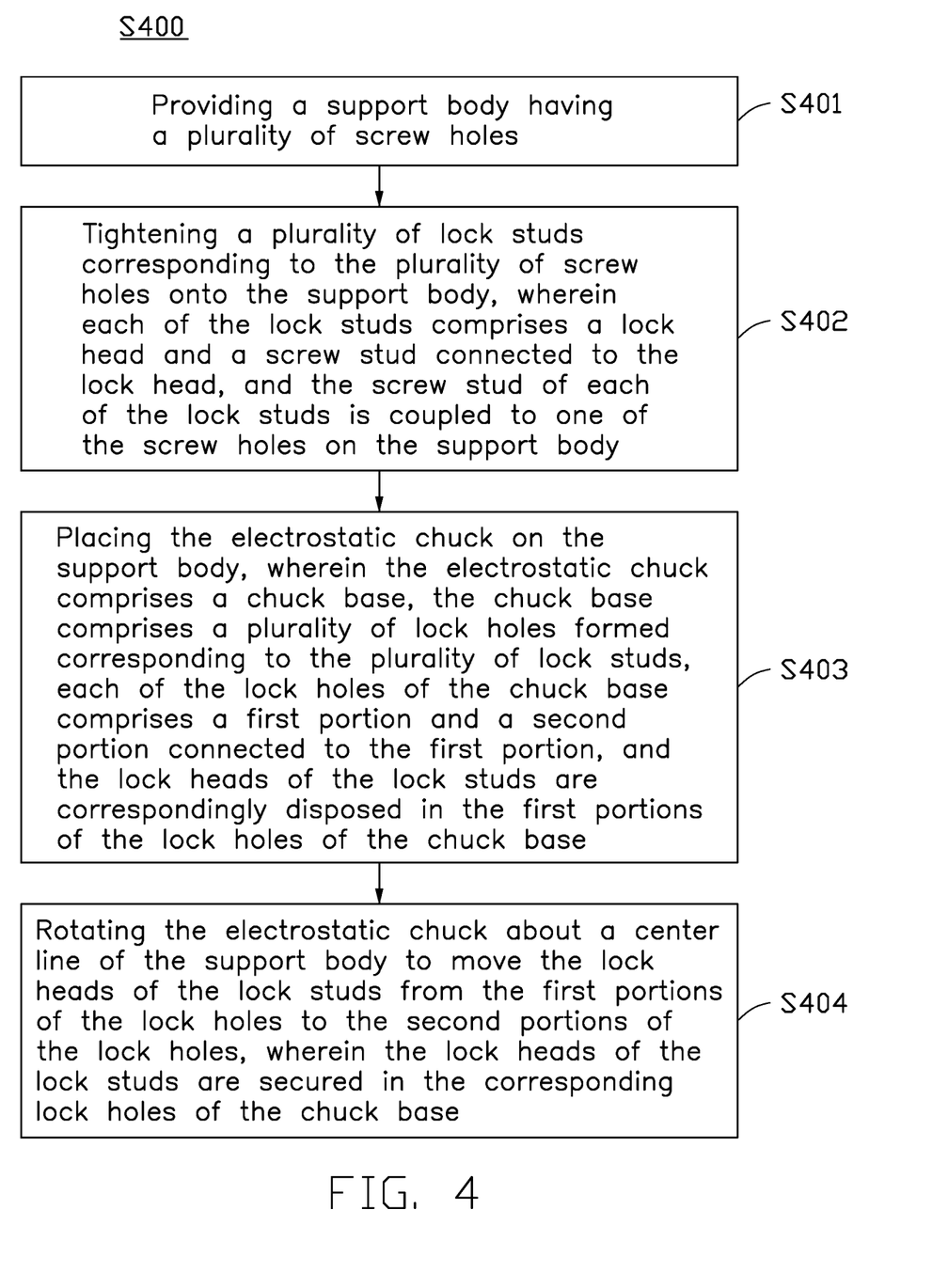
FIG. 4 is a flow chart of an example method of securing an electrostatic chuck according to an implementation of the present disclosure.

Referring to FIG. 4, a flowchart of an example method of securing an electrostatic chuck according to an implementation of the present disclosure is illustrated. As shown in FIG. 4, the method S400 includes actions S401 to S404. The actions of the method S400 may be described with reference to FIGS. 3A to 3G. In action S401, a support body 330 having a plurality of screw holes 331 is provided. Each of the screw holes 331 of the support body 330 has at least one screw thread on its inner surface, as shown in FIG. 3A.

In action S402, a plurality of lock studs 320 corresponding to the plurality of screw holes 331 is tightened onto the support body 330, as shown in FIG. 3B. Each of the lock studs 320 includes a lock head 321 and a screw stud 322 connected to the lock head 321. The screw stud 322 of each of the lock studs 320 is coupled to one of the screw holes 331 on the support body 330. In one implementation, the support body 330 has eight screw holes 331. Correspondingly, eight lock studs 320 are tightened onto the support body 330. In other implementations, the amount of the lock studs 320 may be more than eight, such as ten to thirty.

In action S403, the electrostatic chuck 310 is placed on the support body 330, as shown in FIG. 3C. The electrostatic chuck 310 includes the chuck base 313. The chuck base 313 of the electrostatic chuck 310 includes a plurality of lock holes 314 formed corresponding to the plurality of lock studs 320. Each of the lock holes 314 of the chuck base 313 includes a first portion 314a and a second portion 314b connected to the first portion 314a. The lock heads 321 of the lock studs 320 are correspondingly disposed in the first portion 314a of the lock holes 314 of the chuck base 313.

In action S404, the electrostatic chuck 310 is rotated about a center axis of the support body 330 to move the lock heads 321 of the lock studs 320 from the first portion 314a of the lock holes 314 to the second portion 314b of the lock holes. Therefore, the electrostatic chuck 310 is secured onto the support body 330, as shown in FIG. 3D. The lock head 321 of each of the lock studs 320 is secured in the corresponding lock hole 314 of the chuck base 313. When the lock heads 321 of the lock studs 320 are disposed in the first portions 314a of the lock holes 314, the electrostatic chuck 310 is in an unlock state. When the lock heads 321 of the lock studs 320 are disposed in the second portions 314b of the lock holes 314, the electrostatic chuck 310 is in a lock state. When rotating the electrostatic chuck 310, the electrostatic chuck 310 is rotated with respect to the support body 330 by an angle of less than 15 degrees. As shown in FIGS. 3F and 3G, the first portion 314a of each of the lock holes 314 has a rectangular cross section. The first portion 314a has a first opening 314c on a bottom surface of the chuck base 313. The second portion 314b of each of the lock holes 314 has a T-shaped cross section. The second portion 314b has a second opening 314d on the bottom surface of the chuck base 313. A width L2 of the second opening 314d of the second portion 314b is smaller than a width L2 of the first opening 314c of the first portion 314a. As shown in FIG. 3D, the lock head 321 of each of the lock studs 320 has a diameter D1 smaller than or equal to the width L1 of the first opening 314c of the first portion 314a of each of the lock holes 314. The diameter D1 of the lock head 321 of each of the lock studs 320 is greater than the width L2 of the second opening 314d of the second portion 314b of each of the lock holes 314.

As described above, by using a combination of lock holes 314 and lock studs 320, the electrostatic chuck 310 is secured onto the support body 330. The electrostatic chuck 310 is rotated with respect to the support body 330 to move the lock heads 321 of the lock studs 320 from the first portion 314a of the lock holes 314 to the second portion 314b of the lock holes 314. In such a manner, the lock studs 320 are secured in the corresponding lock holes 314 of the chuck base 313 of the electrostatic chuck 310. Therefore, the shear stress on the surface of the electrostatic chuck 310 can be reduced to prevent wafer warpage.

The implementations shown and described above are only examples. Many details are often found in the art such as the other features of a chuck assembly and a method of securing an electrostatic chuck. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the implementations described above may be modified within the scope of the claims.

What is claimed is:

1. An electrostatic chuck for holding a wafer, the electrostatic chuck comprising:
   at least one dielectric layer;
   an electrode layer coupled to the dielectric layer; and
   a chuck base comprising a plurality of lock holes;
   wherein the dielectric layer and the electrode layer are disposed on the chuck base, each of the lock holes of the chuck base comprises a first portion and a second portion connected to the first portion, the first portion has a first opening on a bottom surface of the chuck base, the second portion has a second opening on the bottom surface of the chuck base, and a width of the second opening of the second portion is smaller than a width of the first opening of the first portion.

2. The electrostatic chuck of claim 1, wherein an amount of the plurality of lock holes is an even number.

3. The electrostatic chuck of claim 2, wherein the even number falls within a range of eight to thirty.

4. The electrostatic chuck of claim 1, wherein the chuck base has a disc shape, and the plurality of lock holes are concentrically positioned around a center point of the chuck base.

5. The electrostatic chuck of claim 1, wherein the first portion of each of the lock holes has a rectangular cross section, and the second portion of the lock hole has a T-shaped cross section.

6. A chuck assembly for holding a wafer, the chuck assembly comprising:
   an electrostatic chuck comprising:
      at least one dielectric layer;
      an electrode layer coupled to the dielectric layer; and
      a chuck base comprising a plurality of lock holes, wherein the dielectric layer and the electrode layer are disposed on the chuck base, each of the lock holes comprising a first portion and a second portion connected to the first portion, the first portion has a first opening on a bottom surface of the chuck base, the second portion has a second opening on the bottom surface of the chuck base, a width of the second opening of the second portion is smaller than a width of the first opening of the first portion; and
   a support body configured to secure the electrostatic chuck and having a plurality of screw holes formed corresponding to the plurality of lock holes of the chuck base of the electrostatic chuck, wherein the electrostatic chuck is secured to the support body by a plurality of lock studs disposed corresponding to the plurality of lock holes of the chuck base.

7. The chuck assembly of claim 6, wherein each of the plurality of lock studs comprises a lock head and a screw stud, the lock head of each of the lock studs is configured to be disposed in one of the lock holes of the chuck base, and the screw stud of each of the lock studs is configured to be secured in one of the screw holes of the support body.

8. The chuck assembly of claim 7, wherein when the lock heads of the lock studs are correspondingly disposed in the first portions of the lock holes, the chuck assembly is in an unlock state, and when the lock heads of the lock studs are correspondingly disposed in the second portions of the lock holes, the chuck assembly is in a lock state.

9. The chuck assembly of claim 7, wherein the lock head of each of the lock studs has a diameter smaller than or equal to the width of the first opening of the first portion of each of the lock holes, and the diameter of the lock head of each of the lock studs is greater than the width of the second opening of the second portion of each of the lock holes.

10. The chuck assembly of claim 6, wherein the lock studs are made of stainless steel.

11. The chuck assembly of claim 6, wherein the chuck base has a disc shape, and the plurality of the lock holes are concentrically positioned around a center point of the chuck base.

12. A method of securing an electrostatic chuck, comprising:
   providing a support body having a plurality of screw holes;
   tightening a plurality of lock studs corresponding to the plurality of screw holes onto the support body, wherein each of the lock studs comprises a lock head and a screw stud connected to the lock head, and the screw stud of each of the lock studs is coupled to one of the screw holes of the support body;
   placing the electrostatic chuck on the support body, wherein the electrostatic chuck comprises a chuck base, the chuck base comprises a plurality of lock holes formed corresponding to the plurality of lock studs, each of the lock holes of the chuck base comprises a first portion and a second portion connected to the first portion, and the lock heads of the lock studs are correspondingly disposed in the first portions of the lock holes of the chuck base; and
   rotating the electrostatic chuck about a center line of the support body to move the lock heads of the lock studs from the first portions of the lock holes to the second portions of the lock holes, wherein the lock heads of the lock studs are secured in the corresponding lock holes of the chuck base.

13. The method of claim 12, wherein the first portion of each of the lock holes has a rectangular cross section, the first portion has a first opening on a bottom surface of the chuck base, the second portion of each of the lock holes has a T-shaped cross section, the second portion has a second opening on the bottom surface of the chuck base, and a width of the second opening of the second portion is smaller than a width of the first opening of the first portion.

14. The method of claim 13, wherein the lock head of each of the lock studs has a diameter smaller than or equal to the width of the first opening of the first portion of each of the lock holes, and the diameter of the lock head of each of the lock studs is greater than the width of the second opening of the second portion of each of the lock holes.

15. The method of claim 12, wherein when the lock heads of the lock studs are correspondingly disposed in the first portions of the lock holes, the electrostatic chuck is in an unlock state.

16. The method of claim 12, wherein when the lock heads of the lock studs are correspondingly disposed in the second portions of the lock holes, the electrostatic chuck is in a lock state.

17. The method of claim 12, wherein when rotating the electrostatic chuck, the electrostatic chuck is rotated with respect to the support body by an angle of less than 15 degrees.

18. The method of claim 12, wherein an amount of the plurality of the lock holes falls within a range of eight to thirty.

19. The method of claim 12, wherein the chuck base has a disc shape; and the plurality of the lock holes are concentrically positioned around a center point of the chuck base.

* * * * *